United States Patent
Huang

(10) Patent No.: US 9,570,162 B2
(45) Date of Patent: Feb. 14, 2017

(54) DATA READ METHOD FOR FLASH MEMORY

(75) Inventor: Chien-Ting Huang, New Taipei (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 351 days.

(21) Appl. No.: 13/075,053

(22) Filed: Mar. 29, 2011

(65) Prior Publication Data

US 2011/0179306 A1    Jul. 21, 2011

Related U.S. Application Data

(60) Provisional application No. 61/321,967, filed on Apr. 8, 2010.

(51) Int. Cl.
| | |
|---|---|
| *G11C 29/00* | (2006.01) |
| *G11C 11/56* | (2006.01) |
| *G11C 5/04* | (2006.01) |
| *G11C 16/34* | (2006.01) |

(52) U.S. Cl.
CPC ............. *G11C 11/5642* (2013.01); *G11C 5/04* (2013.01); *G11C 16/34* (2013.01)

(58) Field of Classification Search
CPC ......... G11C 11/5642; G11C 16/34; G11C 5/04
USPC ........................................ 714/6.11, E11.055
See application file for complete search history.

(56) References Cited

U.S. PATENT DOCUMENTS

| | | | | |
|---|---|---|---|---|
| 2007/0091677 A1* | 4/2007 | Lasser | ................. | G06F 11/1068 365/185.09 |
| 2009/0323418 A1* | 12/2009 | Cornwell | ............ | G11C 11/5628 365/185.09 |
| 2010/0020604 A1* | 1/2010 | Cornwell | ............ | G11C 11/5642 365/185.03 |
| 2010/0020611 A1* | 1/2010 | Park | ..................... | G06F 11/1068 365/185.09 |
| 2011/0016371 A1* | 1/2011 | Sakimura | ............ | G06F 11/1008 714/763 |
| 2011/0173513 A1* | 7/2011 | DeBrosse | ........... | G06F 11/1048 714/758 |

* cited by examiner

*Primary Examiner* — April Y Blair
*Assistant Examiner* — Thien D Nguyen
(74) *Attorney, Agent, or Firm* — McClure, Qualey & Rodack, LLP

(57) ABSTRACT

The invention provides a data read method. In one embodiment, a flash memory comprises a plurality of pages, and predetermined information is written into each of the pages of the flash memory. First, a target address of the flash memory is read according to a source read voltage to obtain source data and a source error correction code. When error bits of the source data cannot be corrected according to the source error correction code, the predetermined information corresponding to the source data is read from the flash memory according to the source read voltage to obtain correction information. The source data and the source error correction code are then amended according to the difference between the predetermined information and the correction information to obtain an amended data and an amended error correction code. Error bits of the amended data are then corrected according to the amended error correction code.

20 Claims, 6 Drawing Sheets

DATA READ METHOD FOR FLASH MEMORY

CROSS REFERENCE TO RELATED APPLICATIONS

This application claims the benefit of U.S. Provisional Application No. 61/321,967, filed on Apr. 8, 2010, the entirety of which is incorporated by reference herein.

The corresponding Taiwan Patent Application No. 99119641 of this application is filed on Jan. 17, 2010, the entirety of which is incorporated by reference herein.

BACKGROUND OF THE INVENTION

Field of the Invention

The invention relates to data storage, and more particularly to flash memories.

Description of the Related Art

A flash memory is a non-volatile memory. When a power of the flash memory is cut off, the data stored in the flash memory does not disappear. The flash memory is therefore widely used in applications with limited power such as portable electronic devices. A flash memory comprises a plurality of memory cells, and each memory cell stores a voltage with a level selected from $2^N$ predetermined levels. For example, a memory cell of a single level cell (SLC) flash memory stores a voltage with a level selected from two predetermined levels. Similarly, a memory cell of a multiple level cell (MLC) flash memory stores a voltage with a level selected from four predetermined levels, and a memory cell of a triple level cell (TLC) flash memory stores a voltage with a level selected from eight predetermined levels.

When a host wants to read data from a target cell of the flash memory, the controller first determines a set of read voltages, and determines in which range of the read voltages a voltage level stored in the target cell falls, thereby determining the bit value stored in the target cell. For example, when the flash memory is an SLC flash memory, the read voltage set has a single voltage threshold. When a voltage level of a target cell is higher than the voltage threshold, the controller determines the data bit value stored in the target cell to be a bit 0. When the voltage level of the target cell is lower than the voltage threshold, the controller determines the data bit value stored in the target cell to be a bit 1. In addition, when the flash memory is an MLC flash memory, the read voltage set has three voltage thresholds, and the controller can therefore determine the data bit value stored in the target cell to be 11, 01, 00, or 10 according to a comparison result between the voltage level of the target cell and the three voltage thresholds of the read voltage set. Similarly, when the flash memory is a TLC flash memory, the read voltage set has seven voltage thresholds, and the controller can therefore determine the data bit value stored in the target cell to be 111, 011, 001, 101, 100, 000, 010, or 110 according to a comparison result between the voltage level of the target cell and the seven voltage thresholds of the read voltage set. FIG. 1 shows a schematic diagram of a read voltage set corresponding to a TLC memory. The read voltage set has different thresholds in correspondence to a number of data bits stored in a target cell of the TLC memory.

A read voltage therefore determines a data value read out from a target cell of a flash memory. In other words, data bits stored in a target cell of a flash memory are determined to be different values according to different read voltages. When a controller reads a flash memory to obtain read-out data with error bits, the controller therefore should try to read the flash memory according to different read voltages. Thus, the invention provides a data read method for a flash memory. According to the data read method, when read-out data has error bits, the read voltage is appropriately adjusted to read the flash memory again to obtain correct read-out data.

BRIEF SUMMARY OF THE INVENTION

The invention provides a data read method for a flash memory. In one embodiment, the flash memory comprises a plurality of pages, and predetermined information is written into each of the pages of the flash memory. First, a target address of the flash memory is read according to a source read voltage to obtain source data and a source error correction code. Error bits of the source data are then corrected according to the source error correction code in a first error correction process. When the error bits of the source data cannot be corrected in the first error correction process, the predetermined information corresponding to the source data is read from the flash memory according to the source read voltage to obtain correction information. The source data is then amended according to the difference between the predetermined information and the correction information to obtain an amended data. The source error correction code is then amended according to the difference between the predetermined information and the correction information to obtain an amended error correction code. Error bits of the amended data are then corrected according to the amended error correction code in a second error correction process. When the error bits of the amended data are successfully corrected to obtain second output data in the second error correction process, the second output data is sent to a host.

The invention provides a data storage device. In one embodiment, the data storage device is coupled to a host, and comprises a flash memory and a controller. The flash memory comprises a plurality of pages for data storage, wherein predetermined information is written into each of the pages of the flash memory. The controller controls the flash memory to read a target address according to a source read voltage to obtain source data and a source error correction code, and corrects error bits of the source data according to the source error correction code in a first error correction process. When the error bits of the source data cannot be corrected in the first error correction process, the controller controls the flash memory to read the predetermined information corresponding to the source data according to the source read voltage to obtain correction information, amends the source data according to the difference between the predetermined information and the correction information to obtain an amended data, amends the source error correction code according to the difference between the predetermined information and the correction information to obtain an amended error correction code, corrects error bits of the amended data according to the amended error correction code in a second error correction process, and sends the second output data to the host if the error bits of the amended data are successfully corrected to obtain second output data in the second error correction process.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
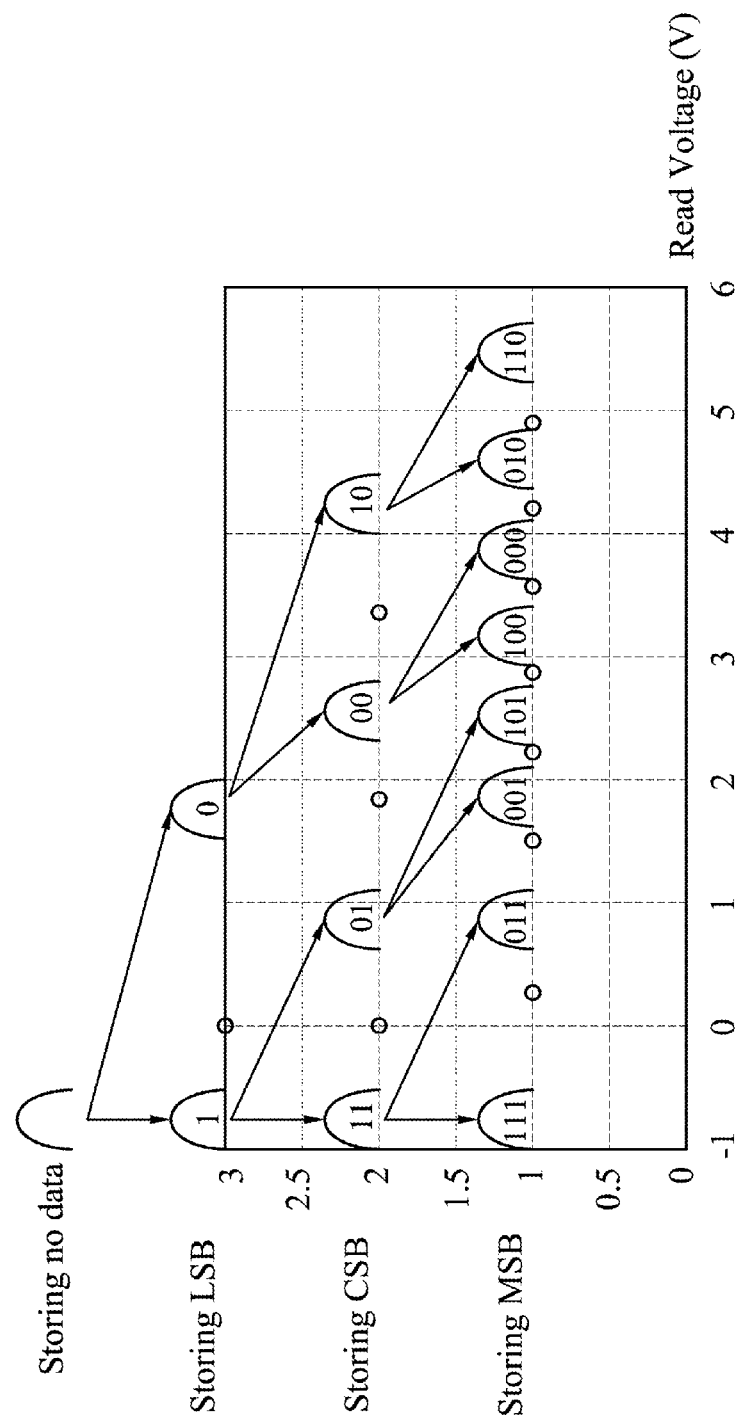
FIG. 1 is a schematic diagram of a read voltage set corresponding to a TLC memory.
Figure 2:
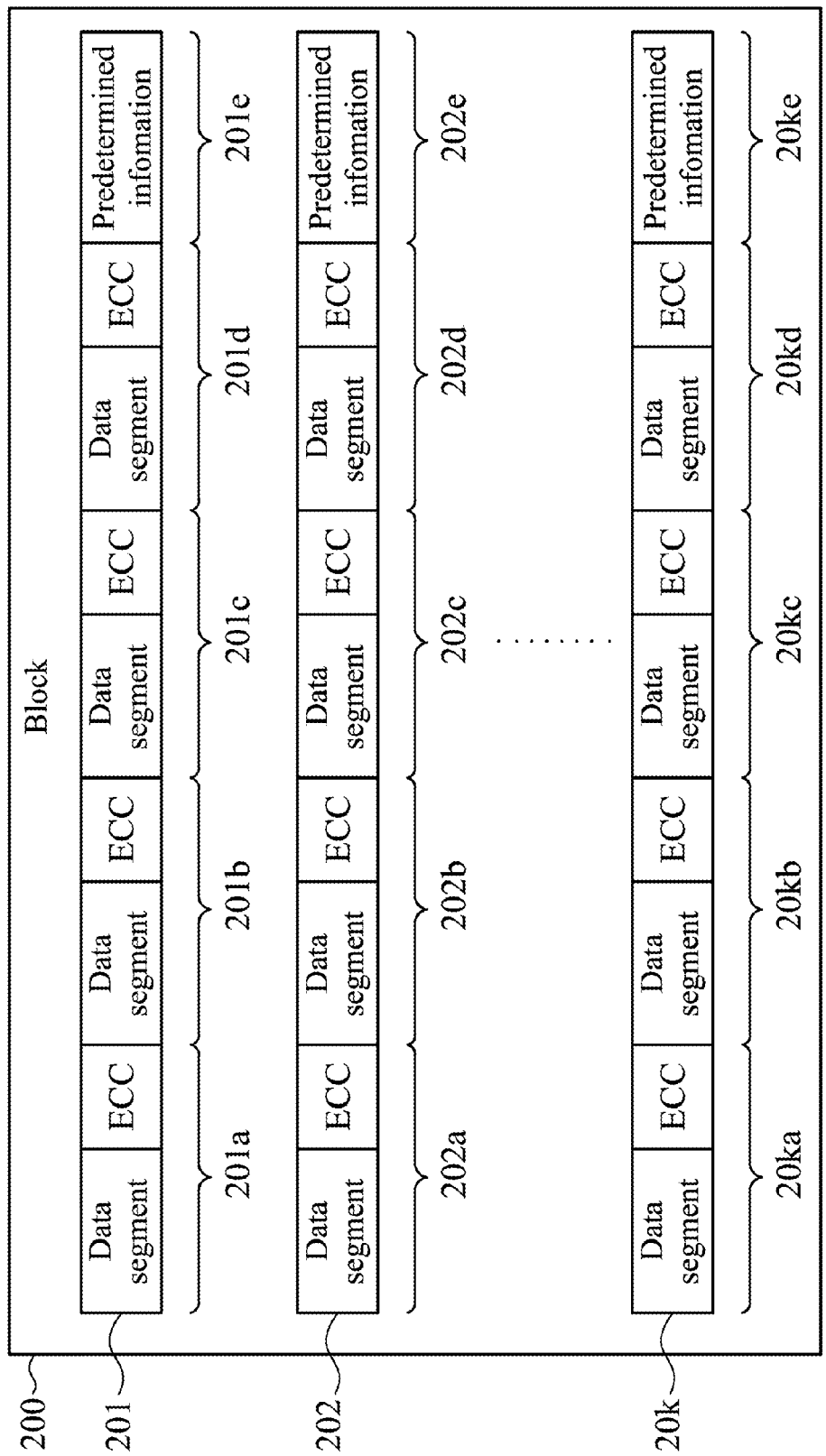
FIG. 2 is a schematic diagram of data being stored in a block of a flash memory according to the invention.

Referring to FIG. 2, a schematic diagram of data being stored in a block 200 of a flash memory according to the invention is shown. The block 200 comprises a plurality of pages 201~20k for data storage. Each page can store a plurality of data sectors. In one embodiment, a data sector has a data amount of 512 bytes, and a page of the block 200 stores 4 data sectors. To correct errors of data written into a flash memory, when a data sector is stored into the flash memory, a controller encodes an error correction code according to the data sector, and writes the error correction code and the data sector together into the flash memory. For example, a page 201 stores four data sectors 201a, 201b, 201c, and 201d, and each of the data sectors 201a, 201b, 201c, and 201d comprises a corresponding error correction code (ECC). In addition, to determine a correct data from a plurality of read-out data corresponding to different read voltages, the controller writes predetermined information together with the data sectors into the flash memory. In one embodiment, each page of the block 200 stores a copy of the predetermined information. For example, the page 201 stores predetermined information 201e. In one embodiment, the data amount of the predetermined information is 1 byte. For example, the byte value of the predetermined information is 0x55 (with bit value 01010101).

Figure 3:
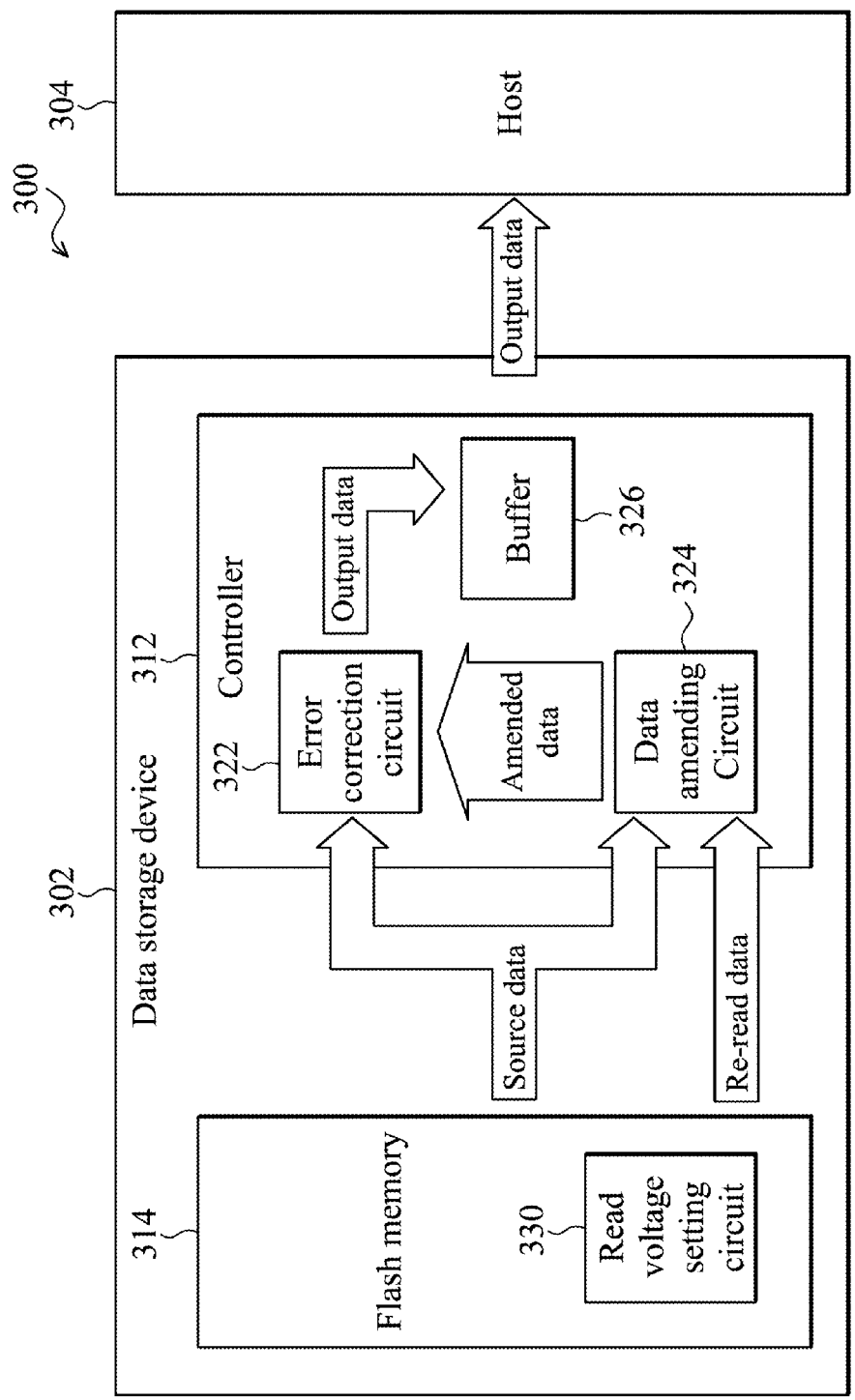
FIG. 3 is a block diagram of a data storage device according to the invention.

Referring to FIG. 3, a block diagram of a data storage device 302 according to the invention is shown. The data storage device 302 is coupled to a host 304. In one embodiment, the data storage device 302 comprises a controller 312 and a flash memory 314. The controller 312 accesses data stored in the flash memory 314 according to commands sent from the host 304. When the host 304 sends a write command to the data storage device 302, the controller 312 writes data to the flash memory 314 according to the write command. When the controller 312 writes data to the flash memory 314, the controller 312 also writes predetermined information to the flash memory 314, as shown in FIG. 2. When the host 304 sends a read command to the data storage device 302, the controller 312 reads data from the flash memory 314 according to the read command. If read-out data from the flash memory 314 comprises error bits which cannot be corrected according to an error correction code, the controller 312 adjusts a read voltage, then reads the flash memory 314 according to the adjusted read voltage to obtain re-read data, and then determines whether the re-read data is correct according to the predetermined information. Thus, errors in the reading process may be corrected.

Figure 4A:
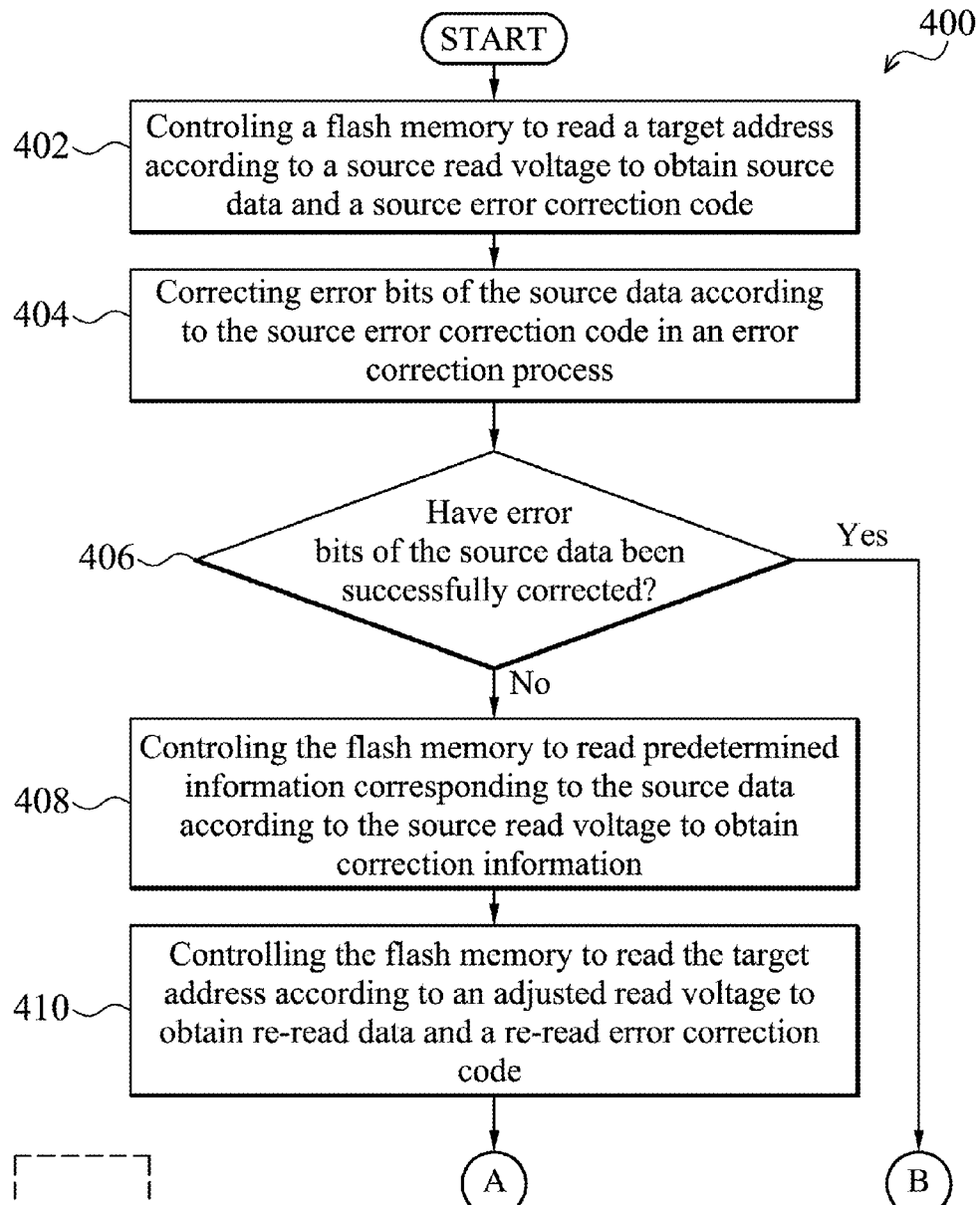
FIG. 4 is a flowchart of a data read method for a flash memory according to the invention.
Figure 4B:
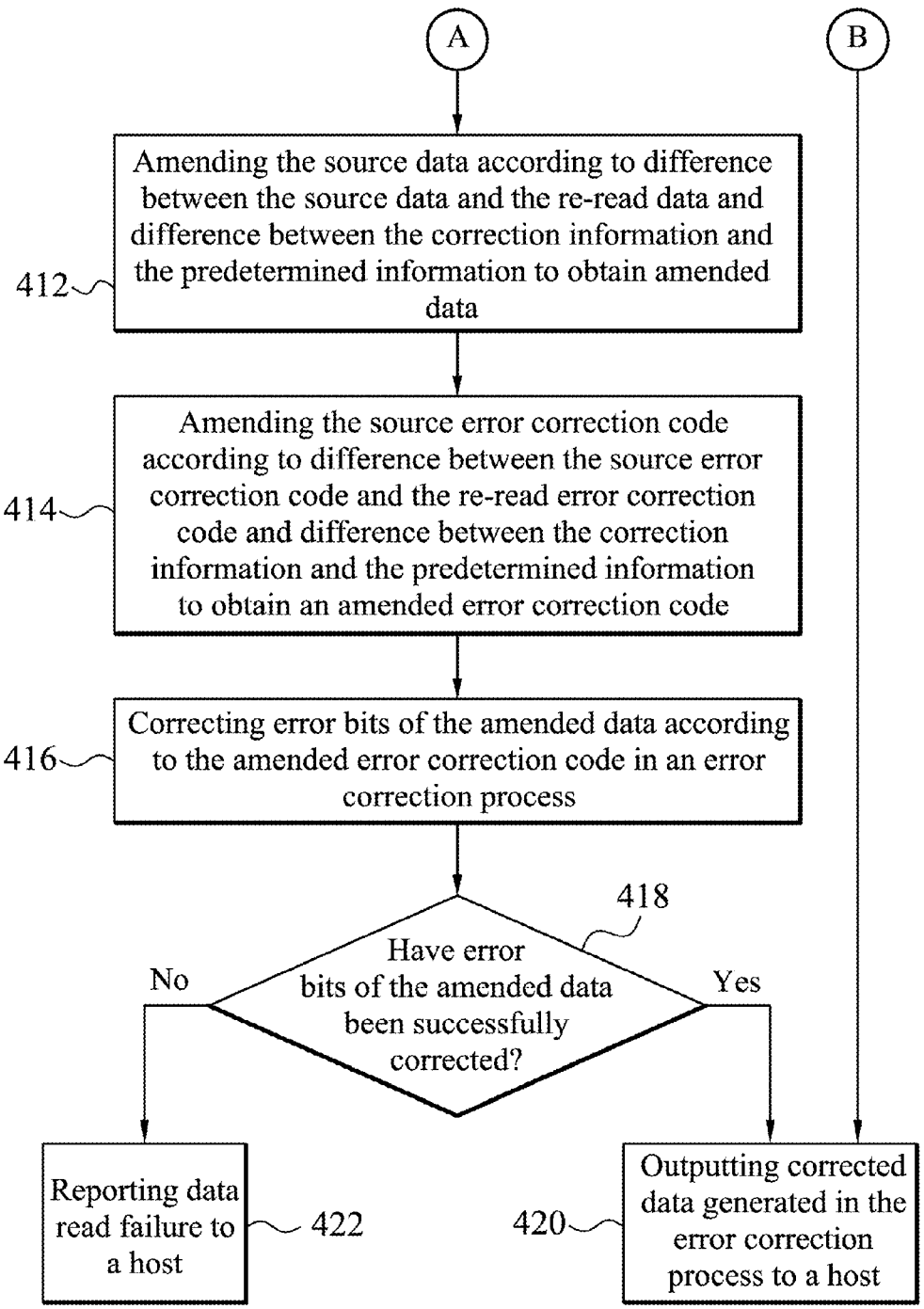

Referring to FIG. 4, a flowchart of a data read method 400 for a flash memory according to the invention is shown. The controller 312 reads data from the flash memory 314 according to the method 400. In one embodiment, the controller 312 comprises an error correction circuit 322, a data amending circuit 324, and a buffer 326. First, the controller 312 directs the flash memory 314 to read a target address according to a source read voltage (step 402). After the flash memory 314 reads the target address according to the source read address to obtain source data and a source error correction code, the data amending circuit 324 corrects the error bits of the source data according to the source error correction code in an error correction process (step 404). If the error bits are successfully corrected in the error correction process to obtain a corrected data (step 406), the controller 312 outputs the corrected data to the buffer 326, and the controller 312 then outputs the corrected data stored in the buffer 326 to the host 304 (step 420).

If the error bits are not successfully corrected in the error correction process (step 406), the error correction circuit 322 cannot generate a corrected data to be sent to the host 304. The controller 312 then directs the flash memory 314 to read predetermined information corresponding to the source data according to the source read voltage from the flash memory 314 to obtain correction information (step 408). In one embodiment, the predetermined information is stored in the same page as that storing the source data, as shown in FIG. 2. The controller 312 can then determine an error bit value according to the difference between the correction information and the predetermined information. For example, assume that the predetermined information has a byte value of 0x55 (with a bit pattern of 01010101), and the correction information read out by the controller 312 has a byte value of 0x54 (with a bit pattern of 01010100). The controller 312 therefore determines that the error bit 0 of the correction information has a corresponding bit value 1 in the predetermined information, and the controller 312 therefore determines the error bit value to be bit 0.

The controller 312 then directs the flash memory 314 to read the target address according to an adjusted read voltage (step 410), wherein the adjusted read voltage has a different voltage level than that of the source read voltage. In one embodiment, the controller 312 adjusts the source read voltage according to the difference between the predetermined information and the correction information to obtain the adjusted read voltage. In one embodiment, the flash memory 314 comprises a read voltage setting circuit 330 which adjusts a level of a read voltage according to the instructions from the controller 312. The flash memory 314 then reads the target address according to the adjusted read voltage to obtain re-read data and a re-read error correction code (step 410). Because the adjusted read voltage has a different voltage level from that of the source read voltage, the re-read data has a different bit pattern from that of the source data, and the re-read error correction code also has a different bit pattern from that of the corrected error correction code. The data amending circuit 324 then amends the difference bits between the re-read data and the source data according to the error bit value to obtain an amended data with a higher accuracy (step 412). Similarly, the data amending circuit 324 also amends the difference bits between the re-read error correction code and the source error correction code according to the error bit value to obtain an amended error correction code with a higher accuracy (step 414). The steps 412 and 414 are further illustrated with FIG. 5.

Figure 5:
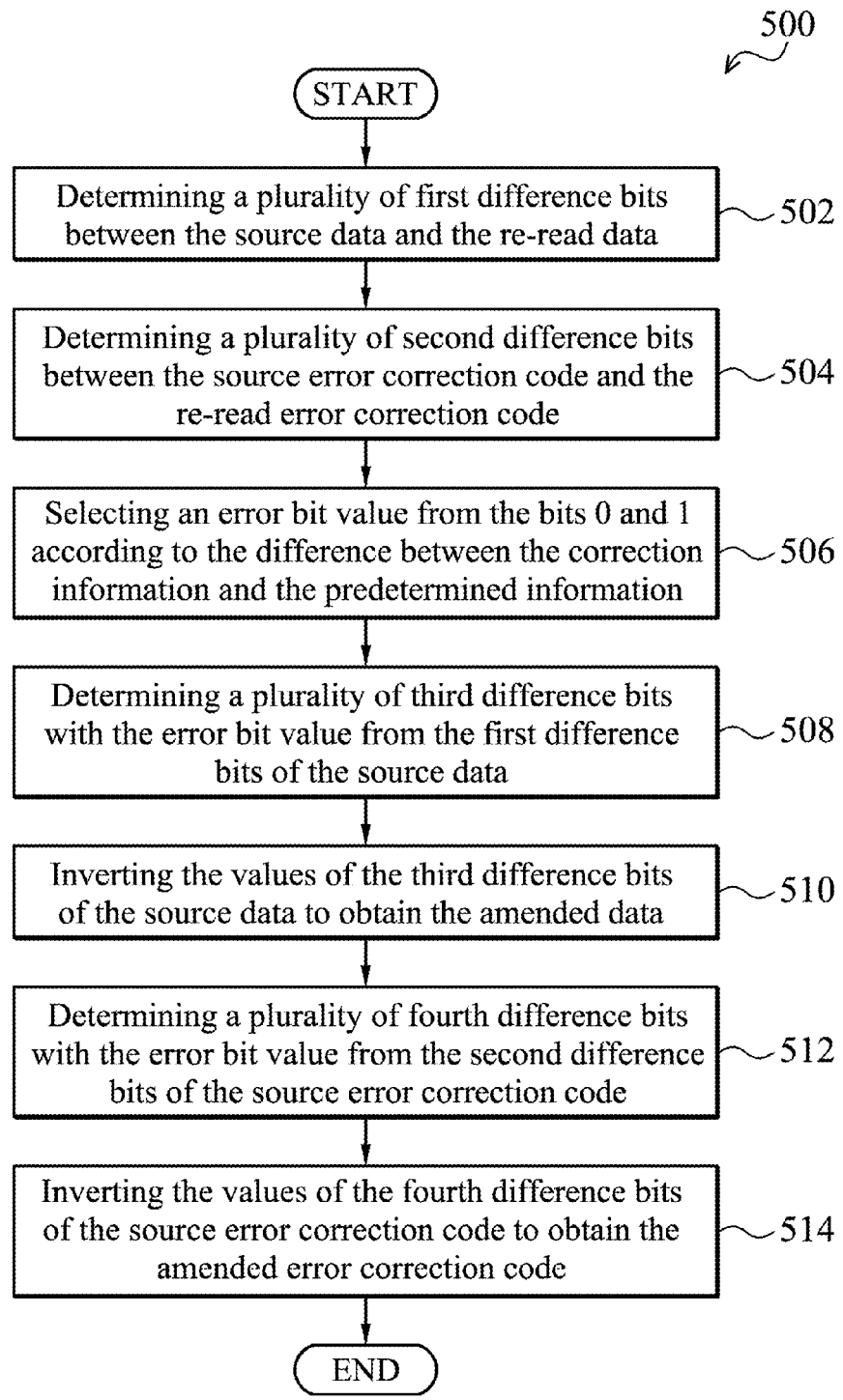
FIG. 5 is a flowchart of a method for amending source data and a source error correction code according to the invention.

Referring to FIG. 5, a flowchart of a method 500 for amending source data and a source error correction code according to the invention are shown. The data amending circuit 324 generates amended data and an amended error correction code according to the method 500. First, the data amending circuit 324 determines a plurality of first differences bits between the source data and the re-read data (step 502). Assume that the source data has a bit pattern of "0000011111", and the re-read data has a bit pattern of "0000111110". The source data therefore has two difference bits, the bit 0 with a fifth bit order and the bit 1 with a tenth bit order, when compared with the re-read data. The data amending circuit 324 then determines a plurality of second difference bits between the source error correction code and the re-read error correction code (step 504). Assume that the source error correction code has a bit pattern of "01010", and the re-read error correction code has a bit pattern of "01011". The source error correction code therefore has a difference bit which is the bit 1 with a fifth bit order when compared with the re-read error correction code.

The data amending circuit 324 then selects an error bit value from the bits 0 and 1 according to the difference between the correction information and the predetermined information (step 506). Assume that the predetermined information has a byte value of 0x55 (with a pattern of 01010101), and the correction information has a byte value of 0x54 (with a bit pattern of 01010100). The data amending circuit 324 can therefore determine an error bit value 0 from the correction information. The data amending circuit 324 then determines a plurality of third difference bits with the error bit value from the first difference bits of the source data (step 508), and then inverts the values of the third difference bits of the source data to obtain the amended data (step 510). For example, because there is only the difference bit 0 with the fifth bit order having a bit value equal to the error bit value 0 in the bit pattern 0000011111 of the source data, the data amending circuit 324 inverts the bit value of the difference bit 0 with the fifth bit order in the source data to obtain an amended data with the bit pattern of 0000111111.

Similarly, the data amending circuit 324 then determines a plurality of fourth difference bits with the error bit value from the second difference bits of the source error correction code (step 512), and then inverts the values of the fourth difference bits of the source error correction code to obtain the amended error correction code (step 514). For example, because there is only the difference bit 0 with the fifth bit order having a bit value equal to the error bit value 0 in the bit pattern 01010 of the source error correction code, the data amending circuit 324 inverts the bit value of the difference bit 0 with the fifth bit order in the source error correction code to obtain an amended error correction code with the bit pattern of 01011.

Finally, after the data amending circuit 324 generates the amended data and the amended error correction code, the data amending circuit 324 sends the amended data and the amended error correction code to the error correction circuit 322. The error correction circuit 322 then corrects error bits of the amended data according to the amended error correction code in an error correction process (step 416). If the error correction circuit 322 can successfully correct the error bits of the amended data to generate corrected data (step 418), the error correction circuit 322 sends the corrected data to the buffer 326. The controller 312 then sends the corrected data stored in the buffer 326 to the host 304 (step 420). Otherwise, if the error correction circuit 322 can not successfully correct the error bits of the amended data (step 418), the controller 312 reports a data read failure to the host 304 (step 422).

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data read method for a flash memory, wherein the flash memory comprises a plurality of pages, and predetermined information is written into each of the pages of the flash memory, and the predetermined information is a binary code with a predetermined value, and the binary code is constituted by a plurality of bits, comprising:
reading a target address of the flash memory according to a source read voltage to obtain source data and a source error correction code;
correcting error bits of the source data according to the source error correction code in a first error correction process;
when the error bits of the source data cannot be corrected in the first error correction process, reading the predetermined information corresponding to the source data from the flash memory according to the source read voltage;
amending the source data according to the difference between the predetermined value of the predetermined information and the predetermined information read from the flash memory when the error bits of the source data cannot be corrected to obtain an amended data;
amending the source error correction code according to the difference between the predetermined value of the predetermined information and the predetermined information read from the flash memory when the error bits of the source data cannot be corrected to obtain an amended error correction code;
correcting error bits of the amended data according to the amended error correction code in a second error correction process; and
when the error bits of the amended data are successfully corrected to obtain second output data in the second error correction process, sending the second output data to a host.

2. The data read method as claimed in claim 1, wherein the predetermined information corresponding to the source data is stored in the same page of the flash memory as that storing the source data.

3. The data read method as claimed in claim 1, wherein the data read method further comprises:
when the error bits of the source data cannot be corrected in the first error correction process, reading the target address of the flash memory according to an adjusted read voltage to obtain re-read data and a re-read error correction code,
wherein when the adjusted read voltage is different from the source read voltage, the amended data is generated according to the difference between the re-read data and the source data, and the amended error correction code is generated according to the difference between the re-read data and the source data.

4. The data read method as claimed in claim 3, wherein generation of the amended data comprises:
determining a plurality of first difference bits between the source data and the re-read data;
selecting an error bit value from the bit values 0 and 1 according to the differences between the predetermined value of the predetermined information and the predetermined information read from the flash memory when the error bits of the source data cannot be corrected;
determining a plurality of third difference bits with the same bit values as the error bit value from the first difference bits; and
inverting the bit values of the third difference bits in the source data to obtain the amended data.

5. The data read method as claimed in claim 4, wherein selection of the error bit value comprises:
when a plurality of bits 0 of the predetermined information, which is read from the flash memory when the error bits of the source data cannot be corrected, correspond to a plurality of collocated bits 1 in the predetermined value of the predetermined information, determining the error bit value to be the bit value 0; and
when a plurality of bits 1 of the predetermined information, which is read from the flash memory when the error bits of the source data cannot be corrected, correspond to a plurality of collocated bits 0 in the predetermined value of the predetermined information, determining the error bit value to be the bit value 1.

6. The data read method as claimed in claim 3, wherein generation of the amended error correction code comprises:
determining a plurality of second difference bits between the source error correction code and the re-read error correction code;
selecting an error bit value from the bit values 0 and 1 according to the difference between the predetermined value of the predetermined information and the predetermined information read from the flash memory when the error bits of the source data cannot be corrected;
determining a plurality of fourth difference bits with the same bit values as the error bit value from the second difference bits; and
inverting the bit values of the fourth difference bits in the source error correction code to obtain the amended error correction code.

7. The data read method as claimed in claim 3, wherein the adjusted read voltage is obtained by adjusting the source read voltage according to the difference between the predetermined value of the predetermined information and the predetermined information read from the flash memory when the error bits of the source data cannot be corrected.

8. The data read method as claimed in claim 1, wherein the data read method further comprises:
when the error bits of the source data are successfully corrected in the first error correction process to obtain first output data, sending the first output data to the host.

9. A data storage device, coupled to a host, comprising:
a flash memory, comprising a plurality of pages for data storage, wherein predetermined information is written into each of the pages of the flash memory, and the predetermined information is a binary code with a predetermined value, and the binary code is constituted by a plurality of bits; and
a controller, controlling the flash memory to read a target address according to a source read voltage to obtain source data and a source error correction code, correcting error bits of the source data according to the source error correction code in a first error correction process, and when the error bits of the source data cannot be corrected in the first error correction process, controlling the flash memory to read the predetermined information corresponding to the source data according to the source read voltage, amending the source data according to the difference between the predetermined value of the predetermined information and the predetermined information read from the flash memory when the error bits of the source data cannot be corrected to obtain amended data, amending the source error correction code according to the difference between the predetermined value of the predetermined information and the predetermined information read from the flash memory when the error bits of the source data cannot be corrected to obtain an amended error correction code, correcting error bits of the amended data according to the amended error correction code in a second error correction process, and sending second output data to the host when the error bits of the amended data are successfully corrected to obtain the second output data in the second error correction process.

10. The data storage device as claimed in claim 9, wherein the predetermined information corresponding to the source data is stored in the same page of the flash memory as that storing the source data.

11. The data storage device as claimed in claim 9, wherein when the error bits of the source data cannot be corrected in the first error correction process, the controller controls the flash memory to read the target address according to an adjusted read voltage to obtain re-read data and a re-read error correction code, generates the amended data according to the difference between the re-read data and the source data, and generates the amended error correction code according to the difference between the re-read data and the source data, wherein the adjusted read voltage is different from the source read voltage.

12. The data storage device as claimed in claim 11, wherein when the controller generates the amended data, the controller determines a plurality of first difference bits between the source data and the re-read data, selects an error bit value from the bit values 0 and 1 according to the difference between the predetermined value of the predetermined information and the predetermined information read from the flash memory when the error bits of the source data cannot be corrected, determines a plurality of third difference bits with the same bit values as the error bit value from the first difference bits, and inverts the bit values of the third difference bits in the source data to obtain the amended data.

13. The data storage device as claimed in claim 12, wherein when the controller selects the error bit value, the controller determines the error bit value to be the bit value 0 if a plurality of bits 0 of the predetermined information, which is read from the flash memory when the error bits of the source data cannot be corrected, correspond to a plurality of collocated bits 1 in the predetermined value of the predetermined information, and determines the error bit value to be the bit value 1 if a plurality of bits 1 of the predetermined information, which is read from the flash memory when the error bits of the source data cannot be corrected, correspond to a plurality of collocated bits 0 in the predetermined value of the predetermined information.

14. The data storage device as claimed in claim 11, wherein when the controller generates the amended error correction code, the controller determines a plurality of second difference bits between the source error correction code and the re-read error correction code, selects an error bit value from the bit values 0 and 1 according to the difference between the predetermined value of the predetermined information and the predetermined information read from the flash memory when the error bits of the source data cannot be corrected, determines a plurality of fourth difference bits with the same bit values as the error bit value from the second difference bits, and inverts the bit values of the fourth difference bits in the source error correction code to obtain the amended error correction code.

15. The data storage device as claimed in claim 11, wherein the controller adjusts the source read voltage according to the difference between the predetermined value of the predetermined information and the predetermined information read from the flash memory when the error bits of the source data cannot be corrected to obtain the adjusted read voltage.

16. The data storage device as claimed in claim 9, wherein when the error bits of the source data are successfully corrected in the first error correction process to obtain first output data, the controller sends the first output data to the host.

17. A data storage device coupled to a host computer, comprising:
a flash memory, comprising a plurality of pages for storing data, wherein predetermined information is written into each of these pages, and the predetermined information is a binary code with a predetermined value, and the binary code is constituted by a plurality of bits; and
a controller commanding the flash memory to read a target address according to a source read voltage to obtain source data and a source error correction code, correcting error bits of the source data according to the source error correction code in a first error correction process, commanding the flash memory to read the predetermined information corresponding to the source data according to the source read voltage when the first error correction process cannot correct the error bits of the source data, amending the source data according to the difference between the predetermined value of the predetermined information and the predetermined information read from the flash memory when the error bits of the source data cannot be corrected to generate an amended data, amending the source error correction code according to difference between the predetermined value of the predetermined information and the predetermined information read from the flash memory when the error bits of the source data cannot be corrected to produce an amended error correction code, correcting error bits of the amended data according to the amended error correction code in a second error correction process, and when the error bits of the amended data are successfully corrected to obtain a second output data in the second error correction process, sending the second output data to the host.

18. The data storage device of claim 17, wherein the predetermined information corresponding to the source data is stored in the same page of the flash memory as that storing the source data.

19. The data storage device of claim 17, wherein when the first error correction program cannot correct the error bits of the source data, the controller commands the flash memory to read the target address according to an adjusted read voltage to obtain a re-read data and a re-read error correction code, amend the source data to generate the amended data according to the difference between the source data and re-read data, and amend the source error correction code according to the difference between the source error correction code and the re-read error correction code to produce the amended error correction code, wherein the adjusted read voltage is different from the source read voltage.

20. The data storage device of claim 19, wherein when the controller generates the amended data, the controller determines a plurality of first difference bits between the source data and the re-read data, selects an error bit value from the bit value 0 and 1 according to the difference between the predetermined value of the predetermined information and the predetermined information read from the flash memory when the error bits of the source data cannot be corrected, determines a plurality of third difference bits with the same bit values as the error bit value from the first difference bits, and inverts (flip) the bit values of the third difference bits in the source data to obtain the amended data.

* * * * *